United States Patent [19]

Masuzima et al.

[11] 4,192,061
[45] Mar. 11, 1980

[54] PROCESS AND APPARATUS FOR MANUFACTURE OF PARALLEL LEAD ELECTRONIC COMPONENTS

[75] Inventors: Sho Masuzima; Hisashi Fujita, both of Tokyo, Japan

[73] Assignee: Tokyo Denki Kagaku Kogyo Kabushiki Kaisha, Tokyo, Japan

[21] Appl. No.: 832,303

[22] Filed: Sep. 12, 1977

[30] Foreign Application Priority Data

Sep. 11, 1976 [JP] Japan ............................... 51-108989

[51] Int. Cl.² .......................................... H01R 43/00
[52] U.S. Cl. ................................. 29/854; 29/564.6; 140/1
[58] Field of Search .................... 53/3, 200; 140/1, 71, 140/105; 29/628, 564.6; 206/328, 330, 331

[56] References Cited
U.S. PATENT DOCUMENTS

| | | | |
|---|---|---|---|
| 3,091,835 | 6/1963 | Weiss | 206/328 |
| 3,215,168 | 11/1965 | Dian et al. | 140/71 R |
| 3,398,768 | 8/1968 | VanHoof | 140/71 R |
| 4,077,439 | 3/1978 | Hamuro et al. | 140/105 |

*Primary Examiner*—Lowell A. Larson
*Attorney, Agent, or Firm*—Blum, Kaplan, Friedman, Silberman & Beran

[57] ABSTRACT

A process and apparatus for the manufacture of a continuous web of parallel lead electronic components is provided. Wire for the leads of the components is straightened, cut into uniform predetermined lengths, formed into a U-shaped leadwire and fed onto a continuous moving support band. The parallel leads of the U-shaped lead wires are secured to the support band by adhesive tape at the same time the spacing between the parallel leads is controlled to insure dimensional accuracy. The parallel leads of the open end of the formed lead wires are formed with a cross-over portion and an electronic component element is connected to the formed end.

18 Claims, 24 Drawing Figures

PROCESS AND APPARATUS FOR MANUFACTURE OF PARALLEL LEAD ELECTRONIC COMPONENTS

BACKGROUND OF THE INVENTION

The invention relates generally to an improved process and apparatus for the manufacture of electronic components, and in particular to an improved process and apparatus for the manufacture of a continuous web of parallel lead electronic components.

It has been proposed previously to prepare a continuous web carrier of electronic components of the parallel lead type, such as condensers. The components are arranged at equal intervals on a support band of continuous length from which manufacture, storage, transportation and the automatic insertion of the electronic components into a printed circuit board can be facilitated. When the electronic components on the web carrier are inserted onto a printed circuit board by using an automatic inserting machine, the electronic components must be separated from the web carrier. This is usually performed by cutting the parallel lead wires which overlap the support band and feeding the components into the automatic inserting machine. However, it is critical to maintain the dimensional accuracy of the spacing between the parallel leads in order to be able to insert the leads into the printed circuit board. After the leads are inserted into the board, the leads are bent to grasp the board. Heretofore, it has been difficult to maintain the dimensional accuracy of the spacing between the parallel leads of the electronic components which has led to difficulty in the automatic insertion operation. These difficulties lead to considerable down time of the automatic inserting machine which must be stopped to remove a defective component. Thus, it has been difficult to maintain the speed of the automatic inserting machine for inserting the parallel lead electronic components into the printed circuit board. It is proposed to alleviate these difficulties by controlling the dimensional accuracy of the spacing between the parallel leads of the electronic components during manufacture.

SUMMARY OF THE INVENTION

Generally speaking, in accordance with the invention, a process and an apparatus for the manufacture of a continuous web of parallel lead electronic component are provided. The process includes the steps of feeding a support band of continuous length, cutting a continuous wire into a predetermined length, forming the cut wire into a desired U-shaped lead wire, feeding the U-shaped lead wire onto the support band, fixing the U-shaped lead wire firmly to the support band by means of an adhesive tape while controlling the dimensional accuracy of the spacing between the parallel leads of the U-shaped lead wire and connecting an electronic component element to a terminal of the parallel lead wires.

The apparatus comprises a support band feeding assembly for feeding a support band continuously, a wire forming assembly for forming a U-shaped lead wire having a portion of parallel lead wires from a continuous wire, the wire forming assembly including a wire feeding assembly for feeding the formed U-shaped lead wire onto the support band, a fixing assembly for fixing the U-shaped lead wire on the support band, a dimension controlling assembly for controlling the spacing between the parallel lead wires of the U-shaped lead wire during fixing the U-shaped lead wire onto the support band, and a synchronizing assembly for synchronizing the feed of the U-shaped lead wire with the feed of the support band.

Accordingly, it is an object of the invention to provide an improved process for the manufacture of a continuous web of parallel lead electronic components.

Another object of the invention is to provide an improved apparatus for the manufacture of a continuous web of parallel lead electronic components.

A further object of the invention is to provide an improved process for the manufacture of a continuous web of parallel lead electronic components wherein the spacing between the parallel leads is maintained accurately.

Still another object of the invention is to provide an improved apparatus for the manufacture of a continuous web of parallel lead electronic components wherein the spacing between the parallel leads is maintained accurately.

Another object of the invention is to provide an improved process for the manufacture of a continuous web of parallel lead electronic components usable in automated machinery for mounting the components in printed circuit boards.

A further object of the invention is to provide an improved apparatus for the manufacture of a continuous web of parallel lead electronic components which are usable in an automated machine for mounting the components in a printed circuit board.

Still other objects and advantages of the invention will in part be obvious and will in part be apparent from the specification.

The invention accordingly comprises the several steps and the relation of one or more of such steps with respect to each of the others, and the apparatus embodying features of construction, combination of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
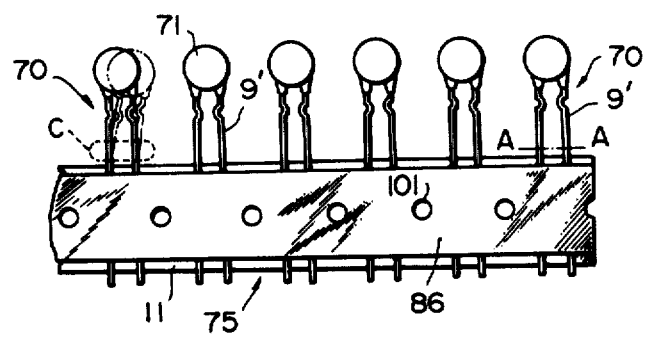
FIG. 1 is a plan view of a portion of a continuous web of parallel lead electronic components constructed and arranged in accordance with the invention.

In FIG. 1, a portion of a continuous web of parallel lead electronic components constructed and arranged in accordance with the invention is shown generally at 75. A series of electronic components 70, each including an electronic element 71 and two formed parallel lead wires 9' are shown secured to a long support band 11 by means of an adhesive tape 86 to form web 75. Web 75 is formed with a plurality of openings 101 for positioning and transporting web 75. Electronic components 70 are removed from web 75 by cutting parallel leads 9' along line A—A for feeding into an automatic printed circuit board inserting machine (not shown) for mounting components 70 into a printed circuit board.

Figure 2:
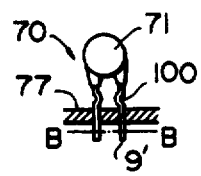
FIG. 2 is a plan view of an electronic component constructed and arranged in accordance with the invention inserted into a printed circuit board, shown in sectional view.
Figure 3:
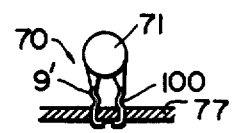
FIG. 3 is a plan view of the electronic component secured in the printed circuit board of FIG. 2.

Referring now to FIGS. 2 and 3, an electronic component 70 is shown inserted into a printed circuit board 77 with parallel leads 9' inserted through holes in circuit board 77 to a stopper portion 100 formed in lead wires 9'. Lead wires 9' then may be cut along line B—B of FIG. 2. Electronic components 70 are securely fastened to printed circuit board 77 as depicted in FIG. 3 by bending the ends of lead wires 9'. The position of electronic component 70 in printed circuit board 77 is maintained by stopper portion 100 and the bent ends of lead wires 9'. Thus, insertion and attachment of electronic component 70 to printed circuit board 77 is completed. In order to facilitate the insertion operation, it is necessary to maintain a high degree of dimensional accuracy with respect to the spacing between formed lead wires 9'.

Figure 4:
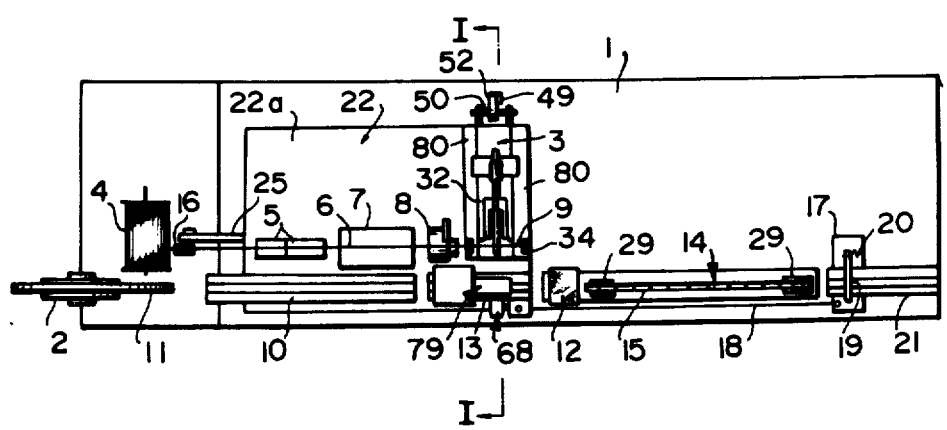
FIG. 4 is a plan view of an apparatus for manufacturing a continuous web of parallel lead electronic components constructed and arranged in accordance with a preferred embodiment of the invention.

Referring now to FIG. 4, an apparatus for the continuous manufacture of a web of parallel lead electronic components in accordance with a preferred embodiment of the invention is shown in plan view. The apparatus includes a support band feed assembly shown generally at 14, a uniform length wire feed assembly shown generally at 7, a wire forming and feeding assembly shown generally at 3, a dimension controlling tool assembly shown generally at 79, a mold tool assembly shown generally at 68, a synchronizing apparatus shown generally at 22, and a machine body 1 for mounting synchronizing apparatus 22, and support band feed assembly 14. Each of the assemblies will be described in detail below.

A feed roll 2 having support band 11 of long length wound thereon and a spool 4 having a wire 6 of long length wound thereon are mounted rotatably on machine body 1. A wire straightening assembly 5, and uniform length wire feed assembly 7, a wire cutter 8 and wire forming and feeding assembly 3 are positioned in series from wire spool 4.

A support band guide rail 10 for guiding support band 11 from feed roll 2 and a formed wire fixing rail 13 for guiding support band 11 when positioning and securing formed lead wire 9' to support band 11 are positioned in series from feed roll 2. Support band feed assembly 14 is positioned in series following formed wire fixing rail 13 to impart a continuous feeding action to support band 11.

Wire-straightening assembly 5, wire feed assembly 7, wire cutter 8, wire forming and feeding assembly 3, guide rails 10 and 13 and dimension controlling tool assembly 79 make up synchronizing apparatus 22. These assemblies are positioned on a swinging stand 22a and operate to feed formed lead wire 9' and support band 11 in synchronization with each other. Synchronizing apparatus 22 reciprocates at a speed set to the unwinding speed of support band 11 so that during the forward movement of one cycle of synchronizing apparatus 22, the relative speed between formed lead wire 9' and support band 11 is zero. The reciprocative movement of synchronizing apparatus 22 is provided by a crank movement shown in FIGS. 5 and 6.

Figure 5:
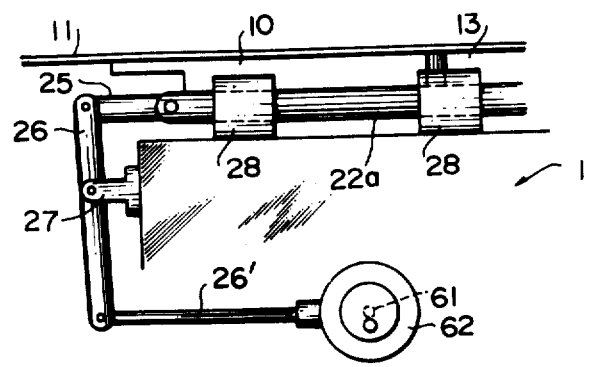
FIG. 5 is a front elevational view showing a swinging assembly for the synchronizing assembly of the apparatus of FIG. 4.
Figure 6:
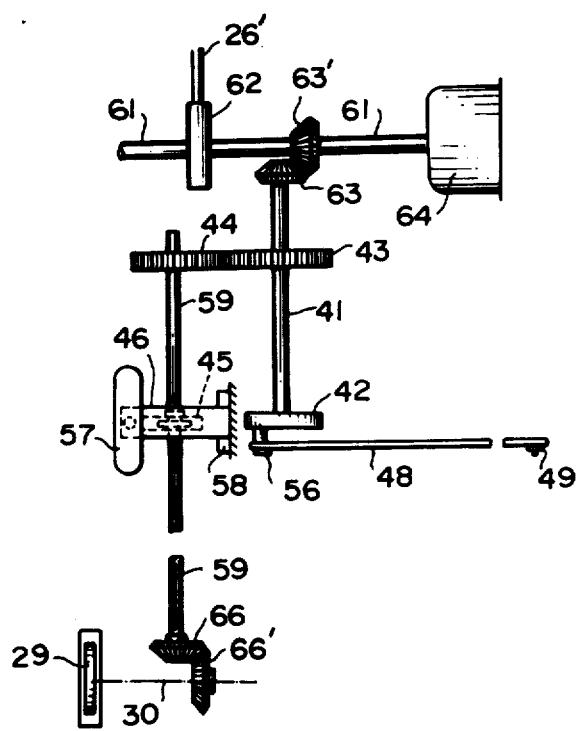
FIG. 6 is a plan view of a power transmission assembly of the apparatus of FIG. 4.

Referring now to FIGS. 5 and 6, a motor 64 and a drive shaft 61 provide rotational movement which is converted to reciprocating movement of swinging stand 22a. A horizontal connecting rod 26' is mounted rotatably at one end to a crank plate 62 which is fixed to drive shaft 61. The opposite end of connecting rod 26' is mounted pivotally to the lower end of a vertical connecting rod 26 which pivots on a supporting stand 27 which is fixed to machine body 1. The upper end of connecting rod 26 is mounted pivotally to a horizontal connecting rod 25 which is mounted pivotally to swinging stand 22a which passes through two guides 28 mounted on machine body 1. The reciprocating movement imparted to swinging stand 22a is arranged so that is is in harmony with the unwinding direction and speed of support band 11.

A predetermined length of a cut wire 9 which has been cut by cutter 8 is formed into U-shaped lead wire 9' and positioned on wire fixing rail 13 by wire forming and feeding assembly 3. The lead wires for the electronic components are deformed at a part in the vicinity of the open end of the "U" by mold tool device 68. The spacing between the parallel leads of formed lead wire 9' is controlled by dimension controlling tool assembly 79.

Figure 16:
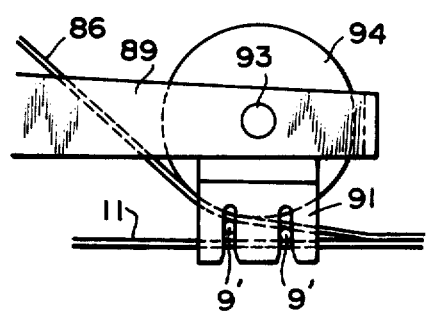
FIG. 16 is a front elevational view of the dimension controlling assembly of FIG. 14.

Formed lead wire 9' is positioned on support band 11 in harmony with the feeding speed of support band 11. Simultaneously therewith, adhesive tape 86 is pressed onto formed lead wire 9' and support band 11 by a roller 94 (as depicted in FIG. 16) of dimension controlling tool assembly 79 and formed wire 9' is secured firmly onto support band 11. During one cycle of formation and securing of formed lead wire 9' by wire forming and feeding assembly 3, synchronizing apparatus 22 completes one reciprocating movement, and thus, formed lead wires 9' are arranged equidistantly and accurately on support band 11.

Figure 7:
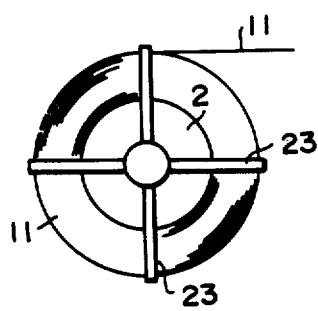
FIG. 7 is a front elevational view of a support band feed roll assembly of the apparatus of FIG. 4.

Referring now to FIG. 7, a frame rod 23 is mounted on feed roll 2 so that wound support band 11 may be fed out without any deflection in the transverse direction. As support band 11 is unwound from feed roll 2 it is introduced onto support band guide rail 10 prior to formed lead wire 9' being secured thereto. In FIG. 4, un-support band 11 is not shown after the beginning of guide rail 10 so that the structure illustrated can be seen more clearly.

After formed lead wire 9' is attached to support band 11 by adhesive tape 86 on formed wire fixing rail 13, openings 101 are formed through support band 11 and adhesive tape 86 by a perforating device shown generally at 12 in FIG. 4. Perforating device 12 forms opening 101 at predetermined locations in support band 11 in synchronization with the longitudinal movement of support band 11 imparted thereto by support band feed device 14. This hole punching operation may be accomplished, for example, by a punching means making a reciprocating movement in the vertical direction. As various devices are known in the art to perform this operation, a detailed illustration of perforating device 12 is not set forth herein.

In a preferred embodiment of the invention, perforating device 14 is synchronized with support band feed device 14 so that openings 101 are formed at precisely positioned intervals in the longitudinal direction of support band 11 and along the transverse midpoint of support band 11 equidistantly between formed lead wires 9' of adjacent electronic components 70 as shown in FIG. 1. When one opening 101 is formed between two adjacent electronic components 70 on support band 11 in this manner, the subsequent operation of inserting electronic components 70 carried on web 75 one by one into a printed circuit board by an automatic printed circuit board inserting machine can be improved remarkably.

Figure 8:
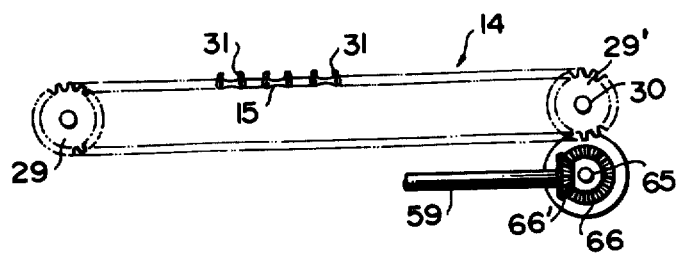
FIG. 8 is a front elevational view of a support band feed assembly of the apparatus of FIG. 4.

As shown in FIG. 8, support band feed assembly 14 includes a feeding member 15, such as an endless chain hung on a wheel 29 mounted rotatably to the base of feed assembly 14 and spaced from a drive wheel 29' fixed to a shaft 30. Feeding member 15 is formed with a plurality of projections 31 which are spaced to engage with openings 101 formed in support band 11 to impart an unwinding movement to support band 11. Rotational movement is imparted to drive wheel 29' by motor 64 and drive shaft 61 as shown in FIG. 6. A bevel gear 63' fixed to shaft 61 engages a bevel gear 63 mounted to shaft 41. A gear 43 fixed to shaft 41 engages a gear 44 fixed to shaft 59. A bevel gear 66 fixed to shaft 59 engages a bevel gear 66' fixed to a shaft 30 which drives drive wheel 29'. By this shaft and gear arrangement drive wheel 29' rotates in the unwinding direction of support band 11 in synchronization with synchronizing apparatus 22. Feeding member 15 guides support band 11 to a take-out rail 21 mounted on machine body 1 at the exit end of support band feed assembly 14 and transports support band 11 through a cutting device 17 positioned across take-out rail 21.

Spool 4 is positioned on machine body 1 so that wire 6 wound thereon can be guided readily into wire straightening assembly 5 by a reel 16 which is mounted slideably on swinging stand 22a so that it transverses wire spool 4 as wire 6 is unwinding. Wire straightening assembly 5 includes a plurality of rollers (not shown) alternately arranged so that wire 6 passes therebetween and is curved repeatedly whereby wire 6 is straightened. The mechanisms employed in wire straightening assembly 5 and cutter 8 are customarily used and well known in the art. Therefore, a detailed illustration of these mechanisms is omitted herein.

Figure 9:
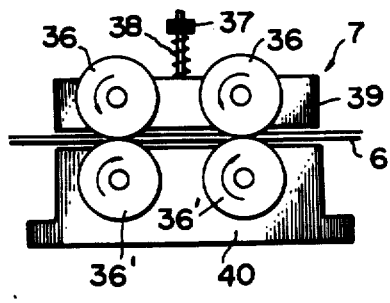
FIG. 9 is a front elevational view of a constant length wire feeding assembly of the apparatus of FIG. 4.

As shown in FIG. 9, wire feed assembly 7 includes a pair of press feed rollers 36 mounted rotatably on an upper plate 39 and a pair of press feed rollers 36' mounted rotatably on a lower plate 40 such that unwinding wire 6 passes therebetween. Upper plate 39 and lower plate 40 are connected by an adjustment screw 37 which is biased by a pressure adjusting spring 38 for adjusting the pressure between press feed rollers 36 and 36' thereby controlling the predetermined length of wire 6 to be cut by cutter 8. Cut wire 9 after it is cut by cutter 8 is supported by a wire holding assembly 34 as shown in FIG. 10.

Figure 10:
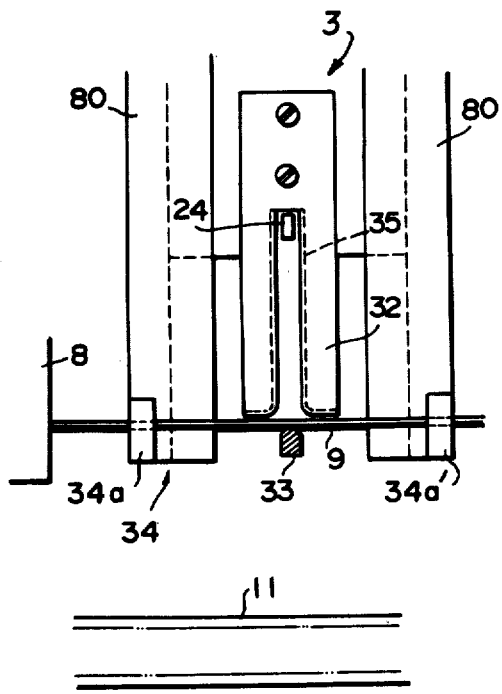
FIG. 10 is a plan view of a wire forming and feeding assembly of the apparatus of FIG. 4.
Figure 17:
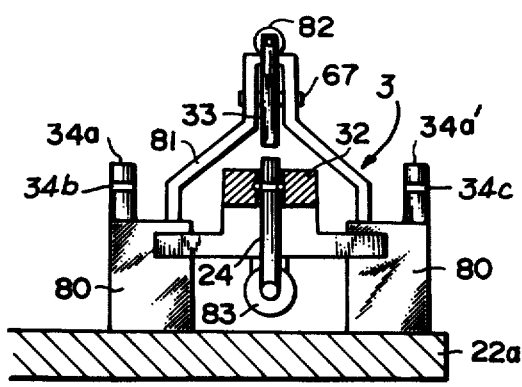
FIG. 17 is a sectional view of the wire forming and feeding assembly of FIG. 10 taken along line II—II of FIG. 13.

Referring now to FIG. 10, wire holding assembly 34 is shown which includes two wire supporting members 34a and 34a' each formed with a horizontal U-shaped groove, 34b and 34c as shown in FIG. 17, for receiving cut wire 9 therein. Both ends of wire 9 which have been cut by cutter 8 after being fed in a predetermined length by wire feed assembly 7 are held at a predetermined position by wire supporting members 34a and 34a'. Wire holding assembly 34 is mounted on swinging stand 22a and positioned along the line formed by wire feed assembly 7 and cutter 8. Wire holding assembly 34 is also arranged such that it makes a reciprocating movement at right angles to cut wire 9 and support band 11. Supporting members 34a and 34a' are mounted on two guides 80 which are secured to swinging stand 22a.

Figure 11:
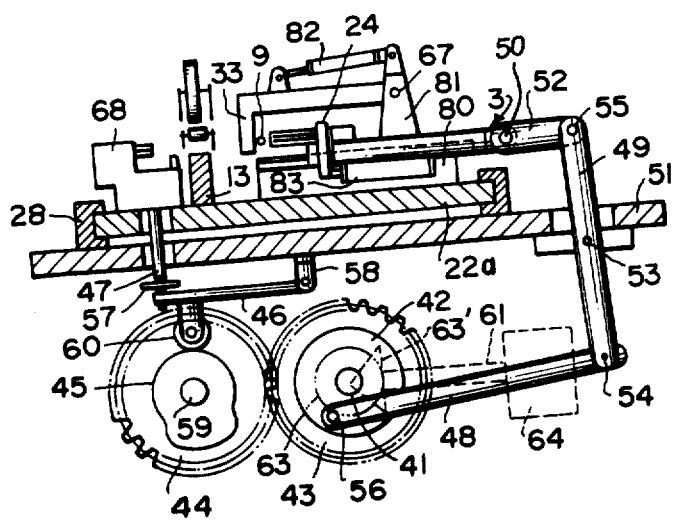
FIG. 11 is a sectional view of the wire forming and feeding assembly of FIG. 10 taken along line I—I in FIG. 4.

Wire forming and feeding assembly 3 includes wire holding assembly 34, and an outer mold 32 and an inner mold 33 as the wire curving means for forming the predetermined length of cut wire 9 into a U-shaped figure. As indicated by line 35 in phantom in FIG. 10, outer mold 32 is formed with a concave groove for forming wire 9 into U-shaped lead wire 9'. Wire forming and feeding assembly 3 further includes a transporting member 24 for feeding formed wire 9' onto support band 11 which is supported and positioned on guide rail 13. For this feeding and positioning operation a mechanical system including a crank 42 as shown in FIG. 11 may be used. Alternative driving mechanisms including air or hydraulic pressure.

Referring now to FIGS. 6 and 11, main drive shaft 41 transmits power for the operation of reciprocating synchronizing apparatus 22 including the operation of feeding formed wire 9' toward support band 11 and the operation of reciprocating wire feeding and forming assembly 3. Crank plate 42 is fixed to one end of drive shaft 41 which is connected to motor 64 by bevel gear 63 secured to the other end of shaft 41 which is engaged with bevel gear 63' fixed to drive shaft 61. One end of a crank lever 48 is mounted eccentrically to crank plate 42 by a crank pin 56. The other end of crank lever 48 is mounted pivotally to the lower end of a vertical connecting lever 49 which is mounted pivotally to a supporting plate 51 by an anchoring pin 53. The upper end of connecting lever 49 is mounted pivotally to the back end of a horizontal connecting lever 52 by a pivoting pin 55. The front end of connecting lever 52 is mounted pivotally to wire forming and feeding device 3 by a pin 50.

As shown in FIGS. 10–13 and 17, outer mold 32 makes a reciprocating movement at right angles to support band 11. Inner mold 33 is supported on a bracket 81 shown in FIG. 17 which is fixed to guides 80 and connected by a pin 67 so that inner mold 33 can swing freely and be displaced in a vertical direction away from formed wire 9' by a cylinder 82 which is mounted pivotally to bracket 81. As shown in FIGS. 11 and 17, transporting member 24 is displaced within the U-shaped groove of outer mold 32 by a cylinder 83 positioned below wire forming and feeding assembly 3.

Figure 14:
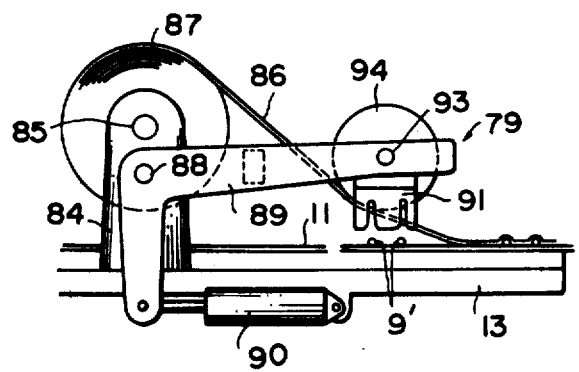
FIG. 14 is a front elevational view of a dimension controlling assembly showing tape about to be secured on a formed lead wire positioned on the support band by the assembly of FIG. 10.
Figure 15:
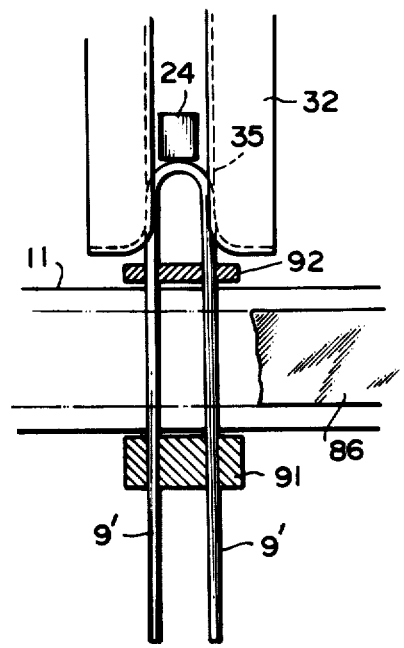
FIG. 15 is a sectional view of the dimension controlling assembly of FIG. 14.
Figure 20:
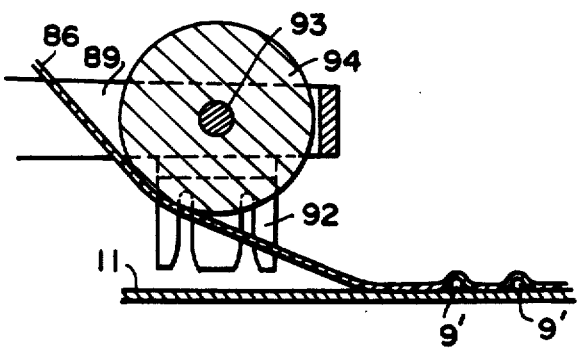
FIG. 20 is a sectional view of the dimension controlling assembly of FIG. 14.

Referring now to FIG. 14, dimension controlling tool assembly 79 is supported by a bracket 84 which is secured to formed wire fixing rail 13. Dimension controlling tool assembly 79 includes a reel 87 having a long length of adhesive tape 86 wound thereon. Reel 87 is mounted rotatably on a pin 85 which is secured to bracket 84. A bell crank 89 is supported pivotally by a pin 88 and operated by a cylinder 90 so that dimension controlling tool assembly 79 moves in the upward direction over wire fixing rail 13. As shown in FIGS. 15, 16 and 20, a pair of dimension controlling tools 91 and 92 are secured to the outer end of bell crank 89. Roller 94 positioned between dimension controlling tools 91 and 92 is mounted rotatably on a pin 93 and secured to bell crank 89. Dimension controlling tools 91 and 92 are formed in substantially E-figured shapes. Tools 91 and 92 are positioned outside support band 11 as shown in cross-section in FIG. 15. Tool 91 is positioned on the open side of U-shaped formed wire 9' which is to be the terminal end of formed wire 9' and is thicker than tool 92 positioned on the closed end of formed wire 9'. Each tool 91 and 92 has two grooves arranged so that when they are lowered by displacement of bell crank 89 each of the parallel leads of formed wire 9' is inserted into the corresponding groove in tools 91 and 92 and a predetermined spacing between the parallel ends of formed lead wire 9' can be maintained with a high degree of accuracy. Each time cylinder 90 is actuated, tools 91 and 92 are lowered to contact formed wire 9' and adhesive tape 86 is compressed between roller 94 and support band 11. By constructing and arranging dimension controlling tool assembly 79 in this manner of the preferred embodiment of the invention, the dimensional accuracy of the spacing between the parallel ends of formed lead wire 9' is maintained at the same time adhesive tape 86 is positioned over formed lead wire 9' and electronic components 70 are secured to support band 11. Tools 91 and 92 are operated to control the maximum spacing and the minimum spacing between the parallel leads of formed wire 9'.

Referring now to FIG. 11, mold assembly 68 is mounted on swinging stand 22a adjacent to formed wire fixing rail 13 for forming the two free ends of formed wire 9' into a terminal. Mold assembly 68 is shown in greater detail in cross-section in FIG. 19 and is operated by power from motor 64 and drive shaft 59 as shown in FIG. 11. Rotational movement of drive shaft 59 is transmitted to cam 45 fixed to gear 44 and a cam roller 60. Cam roller 60 is mounted rotatably to a cam lever 46 which is mounted pivotally by a pin 58 to a supporting plate 51. As shaft 59 rotates and displaces cam lever 46 in the vertical direction a pusher 57 displaces a striker 47 which displaces a supporting mold member 97 in the vertical direction to be positioned between the two parallel leads of formed wire 9'. A pair of bending mold members 95 and 96 are moved in the horizontal direction parallel to the axes of the parallel ends of formed wire 9' so as to come close to the top end portions of formed wire 9' which are gripped between bending molds 95 and 96 and supporting mold 97 to effect deformation to form a crossing terminal portion 102. Simultaneously, pressing mold members 98 and 99 abut lead wire 9' from the horizontal directions to effect deformation of formed lead wire 9' to deform the lead wires to form a stopper portion 100 in each parallel lead of formed wire 9'.

After formed wire 9' is secured to support band 11 and transported across support band feed assembly 14, web 75 is removed from the apparatus by a take-out rail 21 positioned on machine body 1. Cutter assembly 17 is positioned across take-out rail 21 and includes a cutter 19, a spring 20 for biasing cutting 19 and a connecting rod 18 for connecting cutter assembly to synchronizing apparatus 22.

Operation of the apparatus for manufacturing a continuous web of a parallel lead electronic components may be described as follows. A continuous length of wire 6 is unwound from spool 4 through reel 16 by wire feed assembly 7 and is straightened by rollers (not shown) of wire straightening assembly 5. Wire 6 is fed through cutter 8 by wire feed assembly 7 into wire supporting members 34a and 34a'. When the predetermined uniform length of wire 6 has been fed, it is cut by cutter 8.

Figure 12:
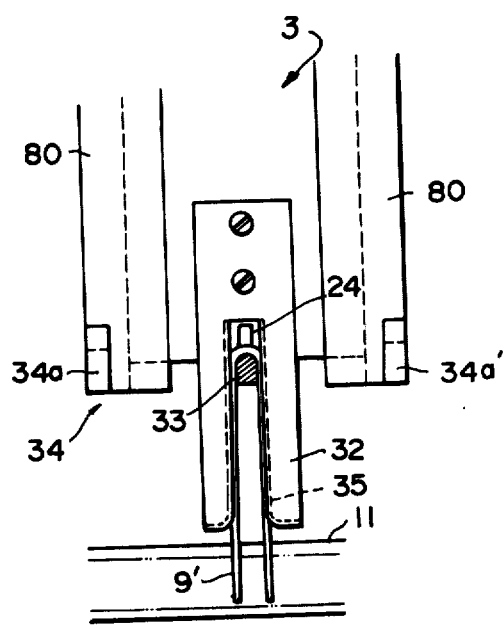
FIG. 12 is a plan view of the wire forming and feeding assembly of FIG. 10 with a formed lead wire.

The crank mechanism shown in FIG. 11 displaces wire forming and feeding assembly 3 towards formed wire fixing rail 13 and outer mold 32 is moved together with transporting member 24 towards support band 11. As inner mold 33 does not move in this direction, the central portion of cut wire 9 is stationary and both ends of cut wire 9 are guided by grooved portion 35 of outer mold 32 and bent into a U-figured shape of formed wire 9'. In the final stage of the molding step, the U-shaped portion of formed lead wire 9' is gripped between transporting member 24 and inner mold 33 as shown in FIG. 12. Then cylinder 82 is actuated and raises inner mold 33 up and away from formed wire 9' and cylinder 83 is actuated moving transporting member 24 towards the open end of outer mold 32. Formed wire 9' is positioned on support band 11 perpendicular to the longitudinal direction of support band 11 as shown in FIG. 13 with the parallel leads overlapping both edges of support band 11.

Figure 13:
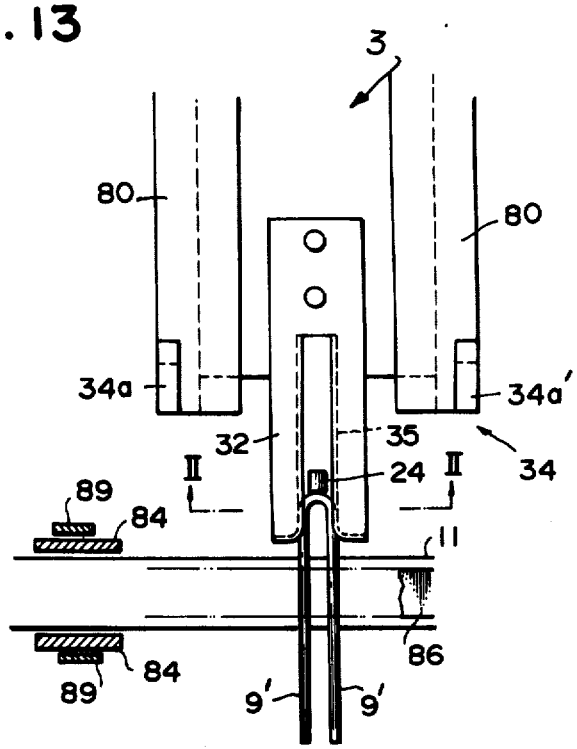
FIG. 13 is a plan view of the wire forming and feeding assembly of FIG. 10 showing the position of the formed lead wire positioned on the support band.

Support band 11 is moved continuously in the lengthwise direction as shown in FIGS. 13 and 14 by support band feed assembly 14. For a certain period of time, as indicated by the position of the elements in FIG. 13 when formed wire 9' is positioned on support band 11, no relative movement occurs between support band 11 and formed wire 9', formed wire fixing rail 13, tool assembly 79 and mold assembly 68 due to the reciprocative movement of synchronizing apparatus 22 which is synchronized with the unwinding speed of support band 11.

Figure 18:
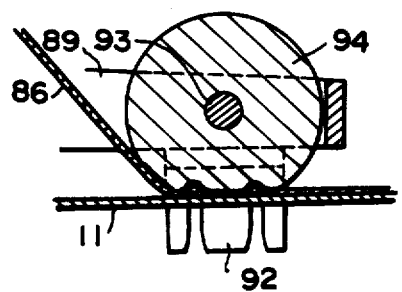
FIG. 18 is a section view of the dimension controlling tool assembly of FIG. 14 showing the position of the elements when adhesive tape is secured over the formed lead wire.

At this time, cylinder 90 is actuated to displace dimension controlling tools 91 and 92 towards support band 11. The parallel leads of formed wire 9' are inserted into the grooves of tools 91 and 92, whereby the spacing between the parallel leads of formed wire 9' is controlled precisely as depicted in FIGS. 15 and 16. When cylinder 90 is actuated further, and tools 91 and 92 are brought into contact with formed wire 9' and support band 11, roller 94 presses adhesive tape 86 over formed wire 9' and onto support band 11 as shown in FIG. 18. During this pressing operation, formed wire 9' is secured firmly to support band 11 and the spacing between the parallel leads of formed wire 9' is effected. Simultaneously, by action of cam 45 and cam roller 60, as shown in FIG. 11, striker 47 pushes upwardly to actuate mold assembly 68. Crossing portion 102 is formed at the open end of formed wires 9' by means of bending mold members 95 and 96 and supporting mold 97 and pressing mold members 98 and 99 are actuated to form stopper portion 100.

When cylinder 90 is contracted and raises dimension controlling tools 91 and 92 and roller 94, swinging stand 22a commences the return movement and a relative movement occurs between swinging stand 22a and formed lead wire 9' which is now attached to support band 11 as shown in FIG. 20. When the steps set forth above are repeated, formed wires 9' are secured equidistantly on support band 11 by adhesive tape 86.

Figure 21:
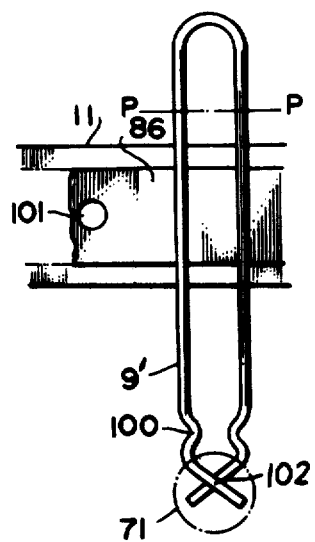
FIG. 21 is a plan view of a single electronic component secured to the support band constructed and arranged in accordance with the invention.

Support band 11 is fed continuously to subsequent steps by support band feed assembly 14 as shown in FIG. 8 with projections 31 engaging holes 101 which have been formed through support band 11 and adhesive tape 86 by perforating device 12 as described above. When support band 11 is transported by feed assembly 14 or traveling on an extension of take-out rail 21 as shown in FIG. 21, electronic component elements 71 are gripped, soldered or coated on crossing portion 102 in a well known manner. The parallel leads are cut along line P—P of FIG. 21 and the electric characteristics of electronic component 70, such as the capacitance or resistance of element 70 may be measured. Thus, the steps of forming the continuous web of parallel lead electronic components is completed and web 75 as shown in FIG. 1 is obtained. Resulting web 75 is then wound on a winding reel or core in predetermined lengths and is cut by cutter 19 according to need.

In the preferred embodiments of the invention, adhesive tape 86 is narrower than support band 11 for several reasons. First, the exact positioning of adhesive tape 86 onto support band 11 in the transverse direction does not become critical so long as the adhesive surface of adhesive tape 86 is not exposed outside support band 11. If the adhesive surface extends beyond support band 11 or extends beyond the lower surface of web 75, problems will result during winding web 75 on a core or a reel. Further, it is contemplated that measurement of electric characteristics of finished electronic components 70, for capacitance, resistance and the like will be performed. A measuring contact element (not shown) can be abutted to a portion of the lead wires that extend outwardly from the edge of adhesive tape 86, but remain on support band 11, whereby support band 11 acts as a support for the measuring means and prevents the lead wires from being deformed or broken accidentally.

The series of electronic components 70 as a whole are heavier than support band 11. In order to feed electronic components 70 into an automatic printed circuit board inserting machine and have them inserted into the board precisely, support band 11 and electronic components 70 must be free from deformation, such as elongation and twisting. Additionally, since support band 11 and electronic component 70 are to be wound on a core or a reel, support band 11 is preferably elastic in the direction of winding in addition to satisfying the above-mentioned requirements that it be free from deformation, such as elongation and twisting.

Once formed lead wires 9' are secured onto support band 11 by adhesive tape 86, electronic components 70 must not become entangled among themselves which will result in breakage during the winding operation or during transportation of web 75. These requirements are accomplished by controlling the relationship between the thickness of support band 11 and that of adhesive tape 86. The ratio of the thickness of support band 11 to that of adhesive tape 86 in conjunction with an appropriate material for forming support band 11, permits web 75 to be transferred or fed under extremely exacting conditions for use in an automatic printed circuit board inserting machine in an extremely smooth manner.

Support band 11 is formed of a relatively flexible material as is most typically exemplified by paper tape. The paper may be Japanese paper, kraft-liner paper using regenerated kraft paper only for its surface layer and board-like thick paper having a large cushioning action containing a polymeric material such as nylon, foamed styro, and the like. As kraft-liner paper is formed from a sulfuric acid-type pulp, it may cause a chemical reaction between the lead wires of the electronic components. Therefore, the surface layer of kraft-liner paper, that is, the contacting surface with the lead wires, is covered with regenerated kraft paper. Further, in order to impart support band 11 with proper tensile properties with respect to elongation in the longitudinal direction, it is preferred to use such paper in which linear fibrous elements of metallic fibers or nonmetallic fibers are woven into Japanese paper or synthetic paper in the longitudinal direction of paper.

When support band 11 is formed from Japanese paper or synthetic paper having a small elasticity in the direction of thickness, the thickness ratio of support band 11 to adhesive tape 86 is preferably within the range of 1.5 to 5, and more preferably within the range of 2.5 to 3.5. When support band 11 is formed of board-like thick paper of the large cushioning type, the thickness ration is preferable within the range of 5 to 15, and more preferably within the range 7.5 to 12.5.

When support band 11 is formed from the above-mentioned materials, elongation, twisting and deformation in the longitudinal direction is controlled. Thus, resulting web 75 can be positioned with precise dimensional accuracy and be wound on a core or a reel easily and securely. When the thickness ratio is maintained within the ranges set forth above, taping and fitting of electronic components 70 to support band 11 is stable and precise. In addition, the accuracy in the distance between each electronic component 70 on web 75 is improved markedly. The above-mentioned criteria provide electronic components supported with precise equal spacing which improves the insertion reliability of an automatic printed circuit board inserting machine. It also facilitates a high stable speed of operation of the inserting machine.

In accordance with the invention, formed wire 9' is fixed and secured to support band 11 at the same time the spacing between the parallel leads of formed wire 9' is controlled precisely by dimension controlling tools 91 and 92. The accuracy of this spacing between the parallel leads can be maintained during the step of forming web 75 and a high degree of accuracy is maintained until the web 75 is removed from the apparatus. More specifically, even when an electronic component 70 undergoes deformation as indicated in phantom in FIG. 1, the portion secured by adhesive tape 86 is not displaced. The precise spacing of the parallel leads in the area indicated generally at C close to the edge of support band 11 can be maintained. As the spacing between the parallel leads can be maintained precisely in finished web 75, the spacing in the respective cut-out and separated components is insured for inserting the cut-out components into a printed circuit board at high speeds by automatic inserting equipment.

Figure 19:
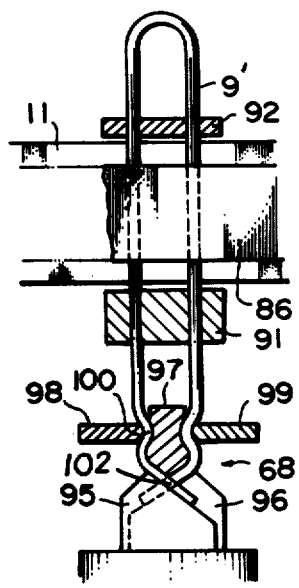
FIG. 19 is a sectional view of a mold assembly and formed lead wire depicted in FIG. 18.

As crossing portion 102 and stopper portions 100 are formed when the spacing between the parallel leads is controlled by dimension controlling tools 91 and 92 the dimensional accuracy of the spacing is maintained during the forming process. Maintaining the spacing between the parallel leads in the area indicated at C in FIG. 1, that is, the base portion of formed wires 9' projecting from the edge of support band 11 on the side of electronic component element 71 is an important benefit of the invention. Accordingly, as shown in FIG. 19, dimension controlling tool 91 is thicker than tool 92 so that the spacing effect imparted by tool 91 is clearly imparted to formed wire 9' in area C. In other embodiments of the invention, tool 92 may not always be employed.

Figure 22:
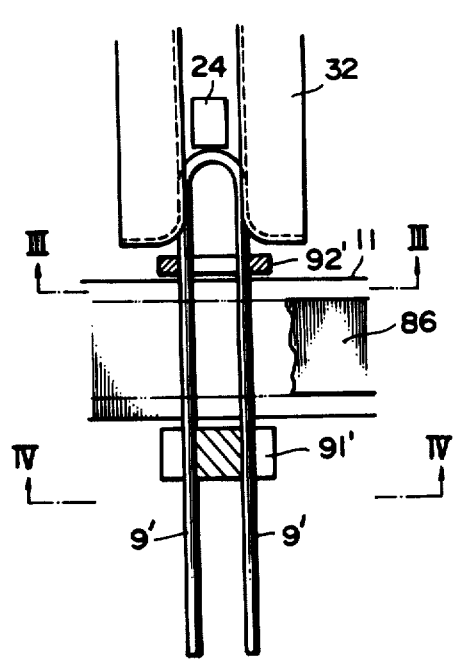
FIG. 22 is a plan view of a dimension controlling assembly constructed and arranged in accordance with another embodiment of the invention.
Figure 24:
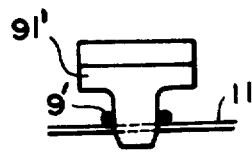
FIG. 24 is a sectional view of the dimension controlling tool assembly taken along line IV—IV in FIG. 22.
Figure 23:
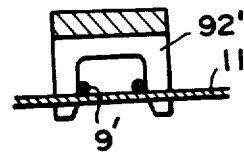
FIG. 23 is a sectional view of the dimension controlling assembly taken along line III—III in FIG. 22.

In the embodiments of the invention when a pair of dimension controlling tools are used, it is not necessary that both tools have an E-figured shape. As shown in FIGS. 22-24, in another embodiment of the invention, good results can be obtained with a tool 92' formed in a U-figured shape for controlling the maximum outer dimension of formed wires 9' and tool 91' formed in a T-figured shape for controlling the minimum inner dimension between the parallel leads of formed wire 9'. More specifically, when formed wire 9' has been shaped by inner mold member 32 and outer mold member 33 and is pushed out of outer mold member 32 by transporting member 24 and released from restraint therein, both parallel leads of formed wire 9' tend to expand slightly by the spring-back action of the wire and the spacing between the parallel ends becomes inaccurate. However tools 91' and 92' are formed and positioned to prevent this spring-back phenomenon from taking place. Expansion of the parallel leads is controlled by tool 92' which defines the outer dimension and tool 91' which defines the inner dimension. When tools 91' and 92' are used, formed wires 9' adhere closely to tool 91' and the spacing can be controlled most precisely in the portion of formed lead wires 9' where precision is required the most. That is, in the portion overlapping support band 11 between the opened end of the U-figured shape which is deformed to form stopper portion 100 and crossing portion 102 for receiving electronic component element 71. Accordingly, the quality of the finished product can be maintained with great accuracy.

In the foregoing embodiments of the invention, the respective assemblies shown have been operated by mechanical power transmission systems or cylinders using air or hydraulic pressure. Hydraulic pressure systems may be used in place of the mechanical systems shown, or, on the contrary, mechanical systems may be used instead of the fluid pressure mechanisms shown specifically. Electrical systems may also be used.

Accordingly, in accordance with the invention, it is possible to produce continuously a web including a plurality of parallel lead electronic components wherein each component is formed with precise spacing maintained between the parallel leads and equidistantly secured to a length of support band by adhesive tape. Furthermore, when the web of electronic components is utilized in an automatic printed circuit board inserting machine the inserting function can be performed without difficulty due to the high degree of dimensional accuracy maintained in the spacing between the parallel leads of the electronic components. Thus, the invention provides a process and apparatus for the preparation of a continuous web of parallel lead electronic components having a high practical utility.

It will thus be seen that the objects set forth above, among those made apparent from the preceding description, are efficiently attained and, since certain changes may be made in carrying out the above process and in the construction set forth without departing from the spirit and scope of the invention, it is intended that all matter contained in the above description and shown in the accompanying drawings shall be interpred as illustrative and not in a limiting sense.

It is also to be understood that the following claims are intended to cover all of the generic and specific features of the invention herein described, and all statements of the scope of the invention which, as a matter of language, might be said to fall therebetween.

We claim:

1. A process for the preparation of a continuous web of parallel lead electronic components comprising:
   continuously feeding a continuous length of a support band;
   forming a wire into a U-shaped lead wire having a portion of parallel leads;
   positioning said U-shaped lead wire transversely onto said support band with said parallel leads projecting from both edges of said support band and controlling the spacing between the parallel leads in at least one portion of said parallel leads projecting from said support band;
   securing said U-shaped lead wire to said support band by an adhesive tape at the same time the spacing between said parallel leads is being controlled in said at least one portion; and
   connecting an electronic component element to one end of said U-shaped lead wire.

2. The process of claim 1, wherein the spacing between the parallel leads is controlled by at least one dimension controlling tool member.

3. The process of claim 1, wherein said support band is fed at a predetermined speed and said U-shaped lead wire is positioned and secured onto said support band in synchronization with the speed of said support band.

4. The process of claim 2, wherein the spacing between said parallel leads is controlled in both said portions of said parallel leads projecting from said support band.

5. The process of claim 4, wherein the spacing between said parallel leads is controlled by limiting the outer dimension between said parallel leads on the closed side of said U-shaped lead wire and by limiting the inner dimension between said parallel lead wires on the open side of said U-shaped lead wire.

6. The process of claim 1, including deforming the open side of said U-shaped lead wire at the same time the spacing between said parallel leads is controlled.

7. The process of claim 6, wherein forming includes cross bending the ends of said parallel leads.

8. The process of claim 6, wherein forming includes forming an indentation in each of said parallel lead wires.

9. An apparatus for the preparation of a continuous web of parallel lead electronic components comprising:
   support band feeding means for continuously feeding a continuous length of a support band;
   wire forming means for forming a U-shaped wire having a portion of parallel leads from a uniform length of wire, including feeding means for feeding said U-shaped lead wire onto said support band;
   dimension controlling means for controlling the spacing between said parallel leads selectively engageable with the parallel leads when the feeding means have placed the parallel leads onto said support band at the time said U-shaped wire is secured to said support band;
   fixing means for securing said parallel leads to said support band; and
   synchronizing means for synchronizing the feeding and securing of said U-shaped lead wire to said support band with the speed of said support band.

10. The apparatus of claim 9, wherein said wire forming means includes:
    wire straightening means for straightening said wire;
    wire feeding means for feeding wire from said straightening means in a predetermined length;
    cutter means for cutting said straightened wire at said predetermined length;
    wire holding means for holding said cut wire; and
    wire curving means for forming said cut wire into a U-shaped lead wire.

11. The apparatus of claim 9, wherein said fixing means includes a reel having a continuous length of adhesive tape wound thereon for securing said U-shaped wire to said support band and a roller for pressing said adhesive tape onto said support band.

12. The apparatus of claim 9, wherein said dimension contolling means includes a bell crank and a cylinder for swinging said bell crank and at least one dimension controlling tool mounted to one end of said bell crank for controlling the spacing between said parallel leads of said U-shaped wire.

13. The apparatus of claim 9, wherein said synchronizing means includes a swinging stand which reciprocates at the same speed as said support band.

14. The apparatus of claim 11, including perforating means for forming holes at predetermined locations through said support band and said adhesive tape.

15. The apparatus of claim 9, including deforming means having a plurality of mold members for deforming one end of said parallel leads.

16. The apparatus of claim 10, wherein said wire forming means includes an outer movable mold member and an inner fixed mold member which is selectively displaceable away from said outer mold member.

17. The apparatus of claim 12, wherein said dimension controlling tool member is formed with two grooves so that when said tool is displaced by said bell crank and cylinder, the parallel leads are inserted into said grooves and a predetermined spacing between said parallel lead wires of said U-shaped lead wire can be maintained.

18. The apparatus of claim 12, wherein said dimension controlling means includes two dimension controlling tool members arranged so that one of said tool members controls the outer dimension between said parallel leads and the other tool controls the inner dimension between said parallel leads.

* * * * *